United States Patent
Pasqualini

(10) Patent No.: US 7,633,311 B2
(45) Date of Patent: Dec. 15, 2009

(54) PECL/LVPECL INPUT BUFFER THAT EMPLOYS POSITIVE FEEDBACK TO PROVIDE INPUT HYSTERESIS, SYMMETRIC HEADROOM, AND HIGH NOISE IMMUNITY

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 4 days.

(21) Appl. No.: 12/008,133

(22) Filed: Jan. 8, 2008

(65) Prior Publication Data
US 2009/0174433 A1    Jul. 9, 2009

(51) Int. Cl.
H03K 19/0175    (2006.01)
(52) U.S. Cl. .......................................................... 326/82
(58) Field of Classification Search ............. 326/82–83, 326/86–87
See application file for complete search history.

(56) References Cited

U.S. PATENT DOCUMENTS

| | | | |
|---|---|---|---|
| 5,436,908 A | 7/1995 | Fluker et al. | 371/1 |
| 5,570,042 A | 10/1996 | Ma | 326/63 |
| 5,815,050 A | 9/1998 | Brooks et al. | 333/161 |
| 5,920,729 A | 7/1999 | Barnett | 395/827 |
| 6,320,413 B1 | 11/2001 | Kurisu | 326/73 |
| 6,404,228 B1 | 6/2002 | Luna et al. | 326/66 |
| 6,597,209 B2 | 7/2003 | Iguchi et al. | 327/108 |
| 6,657,458 B1 | 12/2003 | Sharpe-Geisler | 326/41 |
| 6,714,048 B1 | 3/2004 | Sharpe-Geisler | 326/68 |
| 6,778,569 B2 | 8/2004 | Fischer | 372/38.02 |
| 6,864,707 B2 | 3/2005 | Wong et al. | 326/30 |
| 7,091,904 B2 | 8/2006 | Vantalon et al. | 342/357.03 |
| 7,129,750 B2 | 10/2006 | Dubey | 326/66 |
| 7,154,318 B2 | 12/2006 | Sharma et al. | 327/206 |
| 7,157,980 B2 | 1/2007 | Ogiso | 331/34 |
| 7,215,143 B1 * | 5/2007 | Chung et al. | 326/66 |
| 7,471,107 B1 * | 12/2008 | Fortin et al. | 326/83 |
| 2007/0075776 A1 | 4/2007 | Garlapati et al. | 330/259 |
| 2007/0273406 A1 * | 11/2007 | Kang et al. | 326/83 |

OTHER PUBLICATIONS

Analog Devices, Inc., "Single-Supply, High Speed PECL/LVPECL Comparators", ADCMP551/ADCMP552/ADCMP553, 2004, pp. 1-16.

* cited by examiner

Primary Examiner—Rexford N Barnie
Assistant Examiner—Thienvu V Tran
(74) Attorney, Agent, or Firm—Mark C. Pickering

(57) ABSTRACT

A CMOS based input buffer suitable for use with PECL or LVPECL voltage levels is described. The input buffer utilizes a differential voltage comparator that employs positive feedback to provide input hysteresis, symmetric headroom and increased noise immunity. In addition, the input buffer can utilize a reference voltage that is substantially constant over process, voltage, and temperature.

19 Claims, 8 Drawing Sheets

PECL/LVPECL INPUT BUFFER THAT EMPLOYS POSITIVE FEEDBACK TO PROVIDE INPUT HYSTERESIS, SYMMETRIC HEADROOM, AND HIGH NOISE IMMUNITY

BACKGROUND OF THE INVENTION

1. Field of the Invention

The present invention relates to PECL/LVPECL input buffers, and more particularly, to a PECL/LVPECL input buffer that employs positive feedback to provide input hysteresis, symmetric headroom, and high noise immunity.

2. Description of the Related Art

Emitter coupled logic (ECL) is a family of bipolar logic building blocks that employ low impedance, non-saturating output drivers. For this reason, ECL is capable of reaching very high operating speeds, such as those required for high speed serial communication. ECL can be regarded as having two supply voltages: a positive upper supply voltage VCC that is equal to ground (0V), and a negative lower supply voltage VEE that is 5.2V below ground, or −5.2V.

The ECL logic 1voltage VOH and the ECL logic 0voltage VOL are both referenced to the positive upper supply voltage VCC (which is at ground level, or 0V). Thus, the nominal VOH voltage for ECL is equal to (VCC−0.9V), or −0.9V, and the nominal VOL voltage for ECL is equal to (VCC−1.7V), or −1.7V.

One common variation of ECL is known as 'pseudo ECL' or PECL. PECL is similar to ECL in that it employs the same high speed, low impedance, non-saturating output drivers that are capable of reaching very high operating speeds. PECL differs from ECL, however, in that PECL employs a positive upper supply voltage VCC that is equal to +5V, and a lower supply voltage VEE that is equal to ground (0V). Therefore, an extremely important advantage of PECL over ECL is that PECL can provide a CMOS compatible interface.

As with ECL, the PECL logic 1voltage VOH and the PECL logic 0 voltage VOL are both referenced to the positive upper supply voltage VCC (which is equal to +5V). Thus, the nominal VOH voltage for PECL is equal to (VCC−0.9V), or +4.1V, and the nominal VOL voltage for PECL is equal to (VCC−1.7V), or +3.3V. Since both of the PECL logic levels are referenced to the VCC voltage, both logic levels will vary when the VCC voltage varies. This logic level variation with the VCC voltage is extremely important, because it profoundly influences the design of CMOS compatible PECL input buffers.

There is a variation of PECL known as low voltage PECL (LVPECL). LVPECL is similar to PECL, in that LVPECL employs the same high speed, low impedance, non-saturating output drivers that are capable of reaching very high operating speeds. LVPECL differs from PECL, however, in that LVPECL employs a +3.3V upper supply voltage VCC, in lieu of the +5V VCC voltage employed by PECL. Therefore, the main advantage of LVPECL over PECL is that LVPECL can interface to CMOS chips that utilize a 'low' VCC voltage of 3.3V.

As with PECL, the LVPECL logic 1voltage VOH and the LVPECL logic 0voltage VOL are both referenced to the positive upper supply voltage VCC (which is equal to +3.3V). Therefore, the nominal VOH voltage for LVPECL is equal to (VCC−0.9V), or +2.4V, and the nominal VOL voltage for LVPECL is equal to (VCC−1.7V), or +1.6V.

As with PECL, both of the LVPECL logic levels are referenced to VCC, so both logic levels will vary when the VCC voltage varies. Therefore, as with PECL, this logic level variation with the VCC voltage is extremely important, because it profoundly influences the design of CMOS compatible LVPECL input buffers.

Although PECL and LVPECL input buffers employ different VCC voltages, the logic level difference for both technologies is exactly the same: (VCC−0.9V)−(VCC−1.7V), or 800 mv. Furthermore, because this logic level difference is independent of the VCC supply voltage, it is possible to construct non-standard LVPECL circuits that operate from VCC supply voltages that are less than +3.3V.

For example, LVPECL circuits can be constructed using a nominal VCC supply voltage of only +2.5V. Of course, the main reason for employing a +2.5V non-standard VCC supply voltage is that this voltage allows non-standard LVPECL circuits to directly interface to CMOS chips that utilize a +2.5V VCC supply. However, since this +2.5V VCC supply voltage is non-standard, the systems designer must ensure that the LVPECL drivers and LVPECL receivers both operate from the same non-standard +2.5V VCC supply voltage. Nevertheless, in order to be deemed LVPECL compatible, CMOS chips must employ a +3.3V supply voltage.

As with standard LVPECL, the non-standard LVPECL logic 1voltage VOH and the non-standard LVPECL logic 0voltage VOL are both referenced to the positive upper supply voltage VCC (which is equal to +2.5V). Thus, the nominal VOH voltage for non-standard LVPECL is equal to (VCC−0.9V), or +1.6V, and the nominal VOL voltage for non-standard LVPECL is equal to (VCC−1.7V), or +0.8V.

FIG. 1 shows a timing diagram 100 that illustrates an example of the voltage levels for a prior art PECL signal PS. As shown in FIG. 1, the power supply voltage VCC can vary by ±10% from its nominal value of +5V. As a result, the minimum, typical, and maximum values of VOH and VOL, for the PECL signal PS, will also vary by ±10%.

FIG. 2 shows a timing diagram 200 that illustrates an example of the voltages of a prior art LVPECL signal LS. As shown in FIG. 2, the power supply voltage VCC can vary by ±10% from its nominal value of +3.3V. As a result, the minimum, typical, and maximum values of VOH and VOL, for the LVPECL signal LS, will also vary by ±10%.

FIG. 3 shows a timing diagram 300 that illustrates an example of the voltages of a prior art non-standard (+2.5V) LVPECL signal NS. As shown in FIG. 3, the power supply voltage VCC can vary by ±10% from its nominal value of +2.5V. As a result, the minimum, typical, and maximum values of VOH and VOL, for the LVPECL voltage signal NS, will also vary by ±10%.

DETAILED DESCRIPTION OF THE INVENTION

Figure 1:
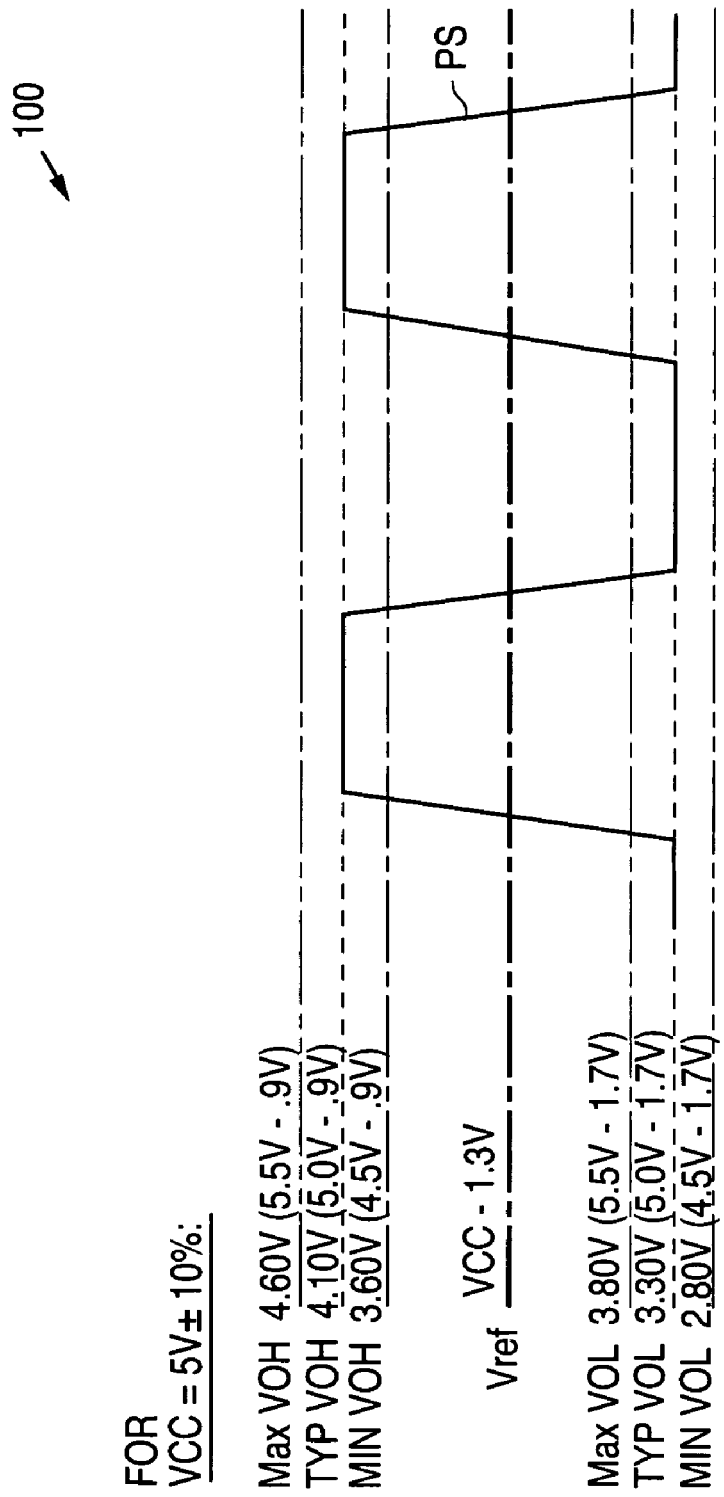
FIG. 1 is a timing diagram 100 illustrating an example of the voltage levels for a prior art PECL signal PS.
Figure 2:
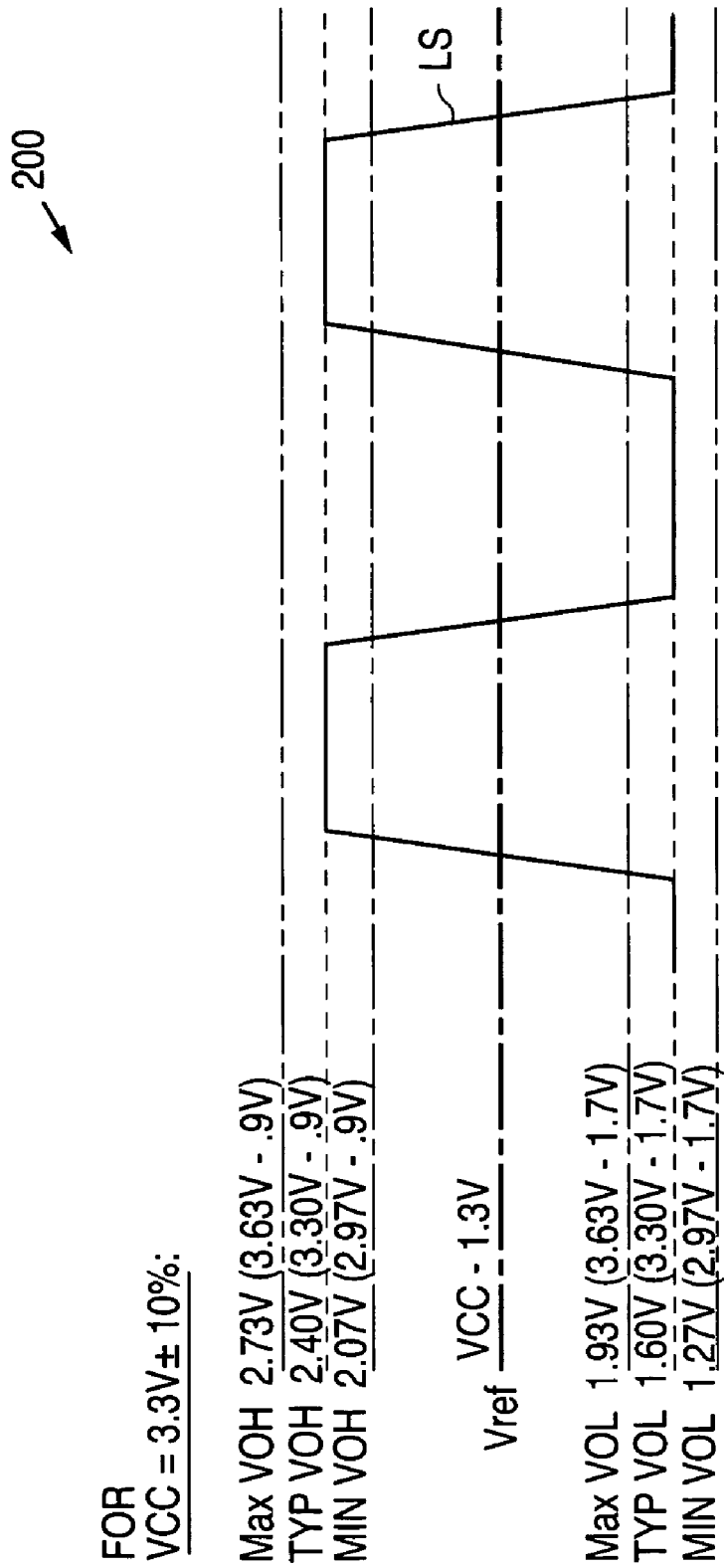
FIG. 2 is a timing diagram 200 illustrating an example of the voltage levels for a prior art LVPECL signal LS.
Figure 3:
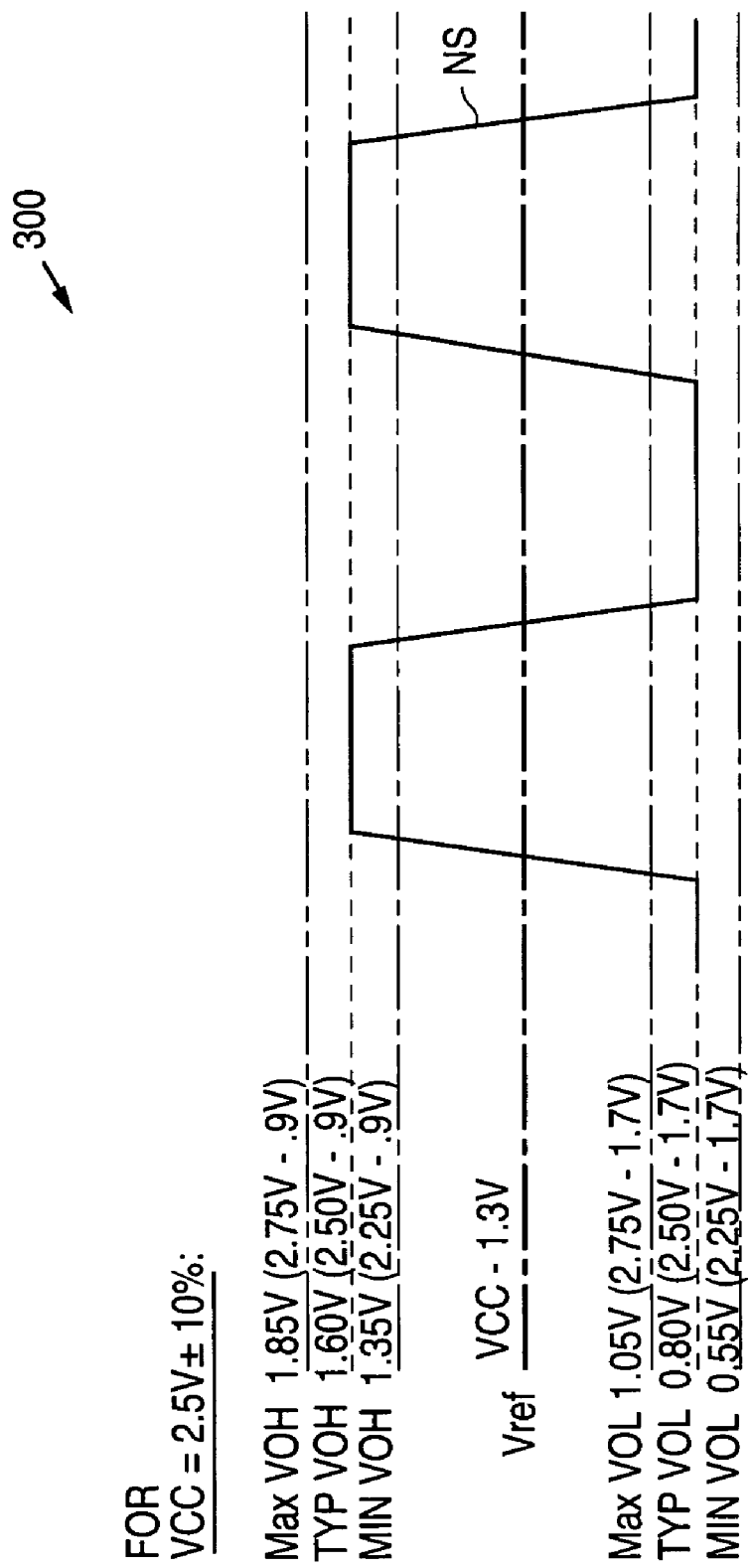
FIG. 3 is a timing diagram 300 illustrating an example of the voltage levels for a prior art non-standard (+2.5V) LVPECL signal NS.
Figure 4:
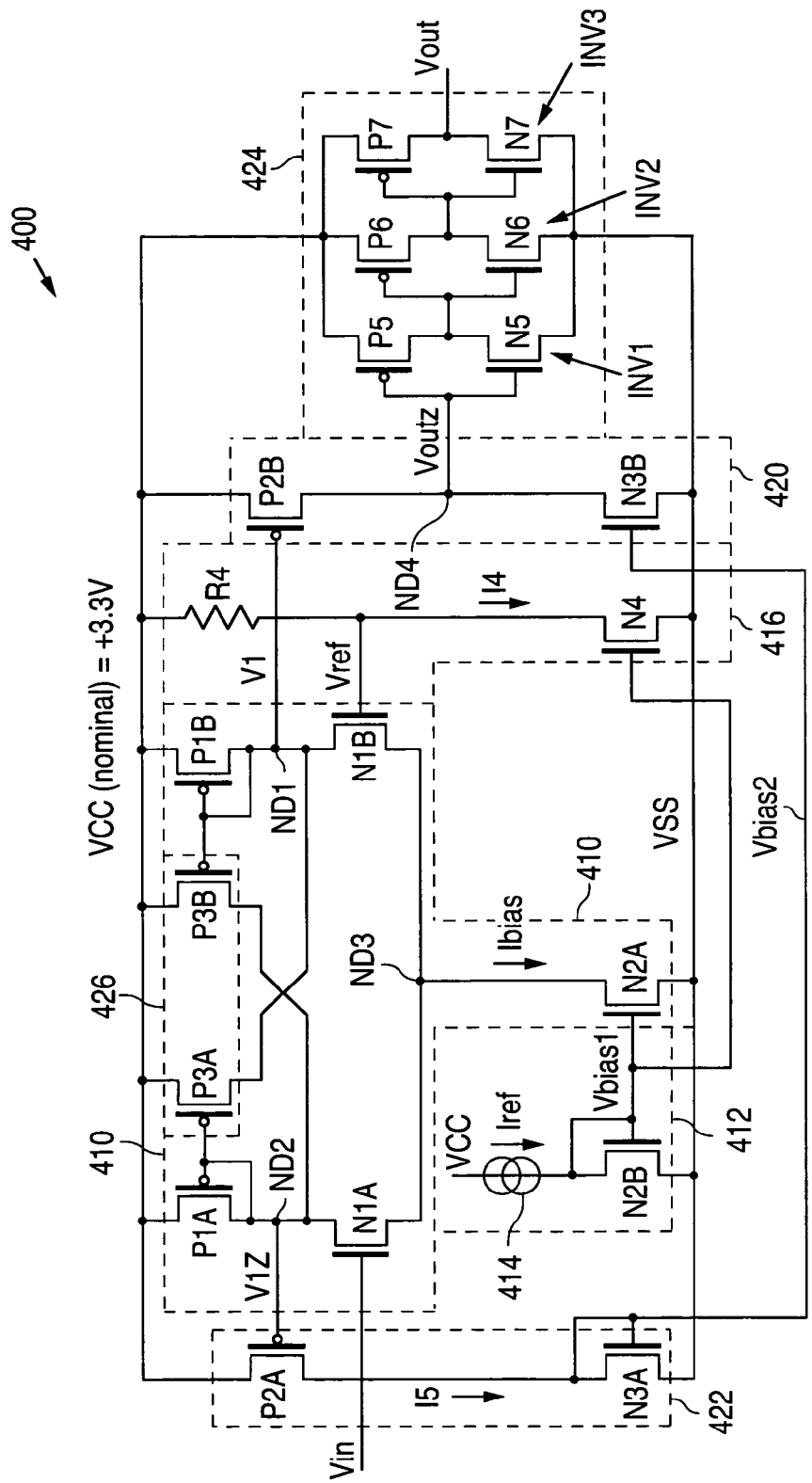
FIG. 4 is a circuit diagram illustrating an example of an LVPECL input buffer 400, in accordance with the present invention.

In accordance with the present invention, FIG. 4 shows a circuit diagram that illustrates an example of an LVPECL input buffer 400. As described in greater detail below, the present invention provides a CMOS input buffer that satisfies the requirements of an LVPECL input buffer, and also provides input hysteresis, high noise immunity, and symmetric headroom.

As shown in FIG. 4, LVPECL input buffer 400 includes a CMOS differential voltage comparator 410 that compares the voltage of an input signal Vin to a reference voltage Vref. In response to the difference between the Vin and Vref voltages, comparator 410 varies the magnitude of an output voltage V1, on an output node ND1, and an inverted output voltage V1Z, on an inverted output node ND2.

In the present example, the input signal Vin should be driven by a device, such as another LVPECL output buffer, that operates from the same nominal VCC voltage as LVPECL input buffer 400 (i.e. +3.3V). The reference voltage Vref, in turn, should be set equal to the power supply voltage VCC minus the midpoint of the LVPECL/PECL VOH/VOL operating range. Thus, the reference voltage Vref should be set equal to VCC−(0.9V+1.7V)/2, or VCC−1.3V. In other words, the reference voltage Vref must be set equal to a fixed voltage amount (1.3V) below the VCC voltage (which can vary by ±10%).

As further shown in FIG. 4, differential voltage comparator 410 includes PMOS transistors P1A and P1B. PMOS transistor P1A has a source connected to the power supply voltage VCC, and a gate and a drain connected to the inverted comparator output node ND2. PMOS transistor P1B has a source connected to the power supply voltage VCC, and a gate and a drain connected to the comparator output node ND1.

Differential voltage comparator 410 also includes NMOS transistors N1A, N1B, and N2A. NMOS transistor N1A has a gate connected to receive the input signal Vin, a source connected to a common comparator node ND3, and a drain connected to the inverted comparator output node ND2. NMOS transistor N1B has a gate connected to receive the reference voltage Vref, a source connected to the common comparator node ND3, and a drain connected to the comparator output node ND1. NMOS transistor N2A has a gate connected to receive a bias voltage Vbias1, a source connected to ground, and a drain connected to the common comparator node ND3.

During normal circuit operation, the W/L ratio of NMOS transistor N2A, and the bias voltage Vbias1, define the magnitude of a constant tail current Ibias, that flows through NMOS transistor N2A. Furthermore, depending upon the relative values of the input voltage Vin and the reference voltage Vref, a portion of the tail current Ibias will flow through transistors P1A and N1A, and the remaining portion of the tail current Ibias will flow through transistors P1B and N1B.

As shown in FIG. 4, LVPECL input buffer 400 includes a voltage generator 412 that generates the bias voltage Vbias1. Moreover, voltage generator 412 includes a constant current source 414 that generates a constant reference current Iref, and a transistor N2B. Transistor N2B has a drain connected to current source 414, a gate connected to the drain of transistor N2B, and a source connected to ground VSS.

During normal circuit operation, the reference current Iref flows through transistor N2B, which sets the bias voltage Vbias1 on the gates of transistors N2B and N2A. Furthermore, since transistors N2B and N2A share the same source voltage (ground VSS), the bias voltage Vbias1 establishes the same gate-to-source voltage on transistors N2B and N2A. As a result, transistors N2B and N2A form a current mirror. The current mirror input is the constant current source 414 (Iref), and the current mirror output is the bias current Ibias. Therefore, the magnitude of the constant tail current Ibias is determined by the magnitude of the reference current Iref, and the width/length (W/L) ratios of transistors N2B and N2A.

For example, if the reference current Iref is equal to 10 ua, and the W/L ratio of transistor N2B is equal to 2, and the W/L ratio of transistor N2A is equal to 4, then the constant tail current Ibias will be equal to (10 ua)*4/2=20 ua. For best current mirror performance, the W/L ratios of transistors N2B and N2A should not exceed 5×-10×. Therefore, the value of the reference current Iref should be chosen in accordance with this constraint.

As shown in FIG. 4, LVPECL input buffer 400 includes a reference voltage circuit 416 that generates the reference voltage Vref on the gate of transistor N1B. Reference voltage circuit 416 includes a resistor R4, which has a first terminal connected to the power supply voltage VCC, and a second terminal connected to the gate of transistor N1B. Furthermore, reference voltage circuit 416 also includes an NMOS transistor N4, that has a gate connected to the gates of transistors N2A and N2B, a drain connected to the second terminal of resistor R4, and a source connected to ground VSS.

During normal circuit operation, transistor N2B and transistor N4 form a current mirror that is driven by the reference current Iref. As a result, the magnitude of an intermediate current I4, which flows through resistor R4 and transistor N4, is determined by the magnitude of the reference current Iref, and the width/length (W/L) ratios of transistors N2B and N4.

For example, if the reference current Iref is equal to 10 ua, and the W/L ratio of transistor N2B is equal to 2, and the W/L ratio of transistor N4 is equal to 3, then the intermediate current I4 will be equal to (10 ua)*3/2=15 ua. Thus, by selecting the W/L ratio of transistor N4 and the value of resistor R4, the nominal value of the reference voltage Vref can be set equal to VCC−1.3V.

As shown in FIG. 4, LVPECL input buffer 400 includes an inverting voltage buffer 420 that includes PMOS transistor P2B and NMOS transistor N3B. The purpose of inverting voltage buffer 420 is to translate the comparator output voltage V1, on comparator output node ND1, into an active low output voltage Voutz, on comparator node ND4.

Referring to FIG. 4, PMOS transistor P2B has a gate that is connected to the comparator output voltage V1, a source connected to the power supply voltage VCC, and a drain connected to the inverting voltage buffer output node ND4. Furthermore, NMOS transistor N3B has a gate that is connected to a bias voltage Vbias2, a drain connected to the inverting voltage buffer output node ND4, and a source connected to ground VSS.

As shown in FIG. 4, LVPECL input buffer 400 includes a voltage generator 422 that includes a PMOS transistor P2A and an NMOS transistor N3A. Furthermore, voltage generator 422 generates an output bias voltage Vbias2.

Referring to FIG. 4, PMOS transistor P2A has a source connected to the power supply voltage VCC, a gate connected to the inverted comparator output voltage V1Z on the inverted comparator output node ND2, and a drain. In addition, NMOS transistor N3A includes a source connected to ground VSS, and a gate and a drain that are connected the drain of transistor P2A and the gate of transistor N3B.

During normal circuit operation, an intermediate current I5 flows through transistors P2A and N3A. Furthermore, intermediate current I5 sets the bias voltage Vbias2 on the gates of transistors N3A and N3B. Moreover, since transistors N3A and N3B share the same source voltage (i.e. ground VSS), the bias voltage Vbias2 establishes the same gate-to-source voltage on transistors N3A and N3B. As a result, transistors N3A and N3B form a current mirror that is driven by the intermediate current I5 that flows through transistors P2A and N3A. Therefore, the current that flows through transistor N3B is determined by the magnitude of the intermediate current I5, and the width/length (W/L) ratios of transistors N3A and N3B.

For example, if the intermediate current I5 is equal to 10 ua, and the W/L ratio of transistor N3A is equal to 2, and the W/L ratio of transistor N3B is equal to 4, then the current that flows through transistor N3B will be equal to (10 ua)*4/2=20 ua.

During normal circuit operation, when comparator output voltage V1 is high, comparator output voltage V1Z will be low. Furthermore, when comparator output voltage V1 is high, transistor P2B will be turned off. In addition, because comparator output voltage V1Z is low, transistor P2A will be turned on, allowing intermediate current I5 to flow to ground VSS through transistor N3A. Because of this, the bias voltage vbias2 will be high enough to turn on transistor N3B, pulling down the inverting buffer output voltage Voutz to ground VSS.

Conversely, when comparator output voltage V1 is low, comparator output voltage V1Z will be high. Furthermore, when comparator output voltage V1 is low, transistor P2B will turned on. In addition, because comparator output voltage V1Z is high, transistor P2A will be turned off, reducing intermediate current I5 to zero. Because of this, the bias voltage vbias2 will be zero, turning off transistor N3B, and thus allowing transistor P2B to pull up the inverting buffer output voltage Voutz to VCC.

As shown in FIG. 4, LVPECL input buffer 400 includes an inverter output circuit 424 whose input is connected to the Voutz output of inverting voltage buffer 420. Inverter output circuit 424, in turn, includes three serially connected inverters INV1-INV3.

Inverter INV1 includes a PMOS transistor P5 and an NMOS transistor N5. PMOS transistor P5 has a drain, a gate connected to inverting buffer node ND4, and a source connected to the power supply voltage VCC. NMOS transistor N5 has a drain connected to the drain of PMOS transistor P5, a gate connected to inverting buffer node ND4, and a source connected to ground VSS.

In addition, inverter INV2 includes a PMOS transistor P6 and an NMOS transistor N6. PMOS transistor P6 has a drain, a gate connected to the drains of transistors P5 and N5, and a source connected to the power supply voltage VCC. NMOS transistor N6 has a drain connected to the drain of PMOS transistor P6, a gate connected to the drains of transistors P5 and N5, and a source connected to ground VSS.

Additionally, inverter INV3 includes a PMOS transistor P7 and an NMOS transistor N7. PMOS transistor P7 has a drain, a gate connected to the drains of transistors P6 and N6, and a source connected to the power supply voltage VCC. NMOS transistor N7 has a drain connected to the drain of PMOS transistor P7, a gate connected to the drains of transistors P6 and N6, and a source connected to ground VSS.

During normal circuit operation, inverters INV1-INV3 of inverter output circuit 424 convert the active low (inverted) output voltage Voutz of inverting buffer 420 into an active high (non-inverted) CMOS compatible output voltage Vout. Furthermore, inverters INV1-INV3 also increase the transistor drive strength at Vout, allowing Vout to quickly swing from rail to rail—e.g., from VSS (0V) to the power supply voltage VCC.

As shown in FIG. 4, LVPECL input buffer 400 also includes a feedback circuit 426, that provides positive feedback to differential voltage comparator 410. This positive feedback, in turn, allows the V1, V1Z and Voutz voltages to change state very quickly.

Referring to FIG. 4, feedback circuit 426 includes PMOS transistors P3A and P3B, which are cross-coupled between the non-inverted comparator output node ND1, and the inverted comparator output node ND2.

As shown in FIG. 4, PMOS transistor P3A has a gate connected to the gate of transistor P1A, a source connected to the power supply voltage VCC, and a drain connected to the comparator output node ND1. Moreover, PMOS transistor P3B has a gate connected to the gate of transistor P1B, a source connected to the power supply voltage VCC, and a drain connected to the inverted comparator output node ND2.

As described in greater detail below, when the comparator input voltage Vin rises above the reference voltage Vref, feedback circuit 426 will source current into comparator output node ND1, causing the V1 voltage at output node ND1 to quickly rise. Similarly, when the comparator input voltage Vin falls below the reference voltage Vref, feedback circuit 426 will source current into comparator output node ND2, causing the V1Z voltage at output node ND2 to quickly rise.

In the above example, the widths and lengths of transistors P1A and P1B must be made equal to each other, the widths and lengths of transistors P2A and P2B must be made equal to each other, the widths and lengths of transistors P3A and P3B must be made equal to each other, the widths and lengths of transistors N1A and N1B must be made equal to each other, and the widths and lengths of transistors N3A and N3B must be made equal to each other. Furthermore, using the condition that the Vin voltage is equal to the Vref voltage, the W/L ratios of transistors P2A, N3A, P2B and N3B should be chosen to set the active low inverting buffer output voltage Voutz close to the CMOS inverter switching point, or approximately VCC/2.

During normal circuit operation, when the comparator input voltage Vin begins to rise above the reference voltage Vref, the following series of events will occur.

First of all, the current in transistors P1A and N1A will increase, which in turn causes the inverting comparator output voltage V1Z to decrease, which in turn causes the intermediate current I5 to increase and the vbias2 voltage to also increase.

Second of all, the current in transistors P1B and N1B will decrease, which in turn causes the non-inverting comparator output voltage V1 to increase, which in turn causes transistor P2B to begin to turn off and transistor N3B to begin to turn on (via transistors P2A and N3A), which in turn causes the output voltage Voutz on node ND4 to decrease towards ground.

Third of all, when the inverting comparator output voltage V1Z begins to decrease, the gate voltage of positive feedback transistor P3A will also begin to decrease, which in turn causes the gate-to-source voltage of transistor P3A to become more negative, which in turn increases the current sourced by transistor P3A, which in turn causes the comparator output voltage V1 to quickly increase, due to the positive feedback being provided by transistor P3A.

Fourth of all, when the non-inverting comparator output voltage V1 begins to increase, the gate voltage of positive feedback transistor P3B will also begin to increase, which in turn causes the gate-to-source voltage of transistor P3B to become less negative, which in turn decreases the current sourced by transistor P3B, which in turn causes the comparator output voltage V1Z to quickly decrease, due to the positive feedback being provided by transistor P3B.

Finally, when the voltage level of the comparator input signal Vin is increased to the upper trip point UTP of the feedback loop provided by cross-coupled transistors P3A and P3B, the inverted comparator output voltage V1Z will begin to quickly fall, and the non-inverted comparator output voltage V1 will begin to quickly rise.

Furthermore, the sharp rise in the non-inverted comparator output voltage V1 will cause a sharp decrease in the current flowing in transistor P2B. At the same time, the sharp fall in the inverted comparator output voltage V1Z will cause a sharp increase in the current flowing in transistor N3B (by way of the bias from transistors P2A and N2A). As a result, the voltage Voutz on node ND4 will begin to quickly decrease to ground VSS because the P2B current has been sharply decreased and the N3B current has been sharply increased.

Since transistors P3A and P3B are used to provide positive feedback, they can also be used to add hysteresis to differential voltage comparator 410. Furthermore, this hysteresis greatly increases the noise immunity of comparator 410, with respect to unbalanced noise on its Vin and Vref inputs.

The amount of positive feedback depends upon the 'ratio of ratios'—for example, the W/L ratio of transistor P1A divided by the W/L ratio of transistor P3A. However, as described above, transistors P1A and P1B must be made identical, and transistors P3A and P3B must also be made identical. As a result, the aforementioned 'ratio of ratios' also applies to the W/L ratio of transistor P1B divided by the W/L ratio of transistor P3B.

Although the above discussion applies to the case where the input signal Vin increases above the reference voltage Vref, a similar analysis can be performed for the case where the input signal Vin decreases below the reference voltage Vref.

Figure 5:
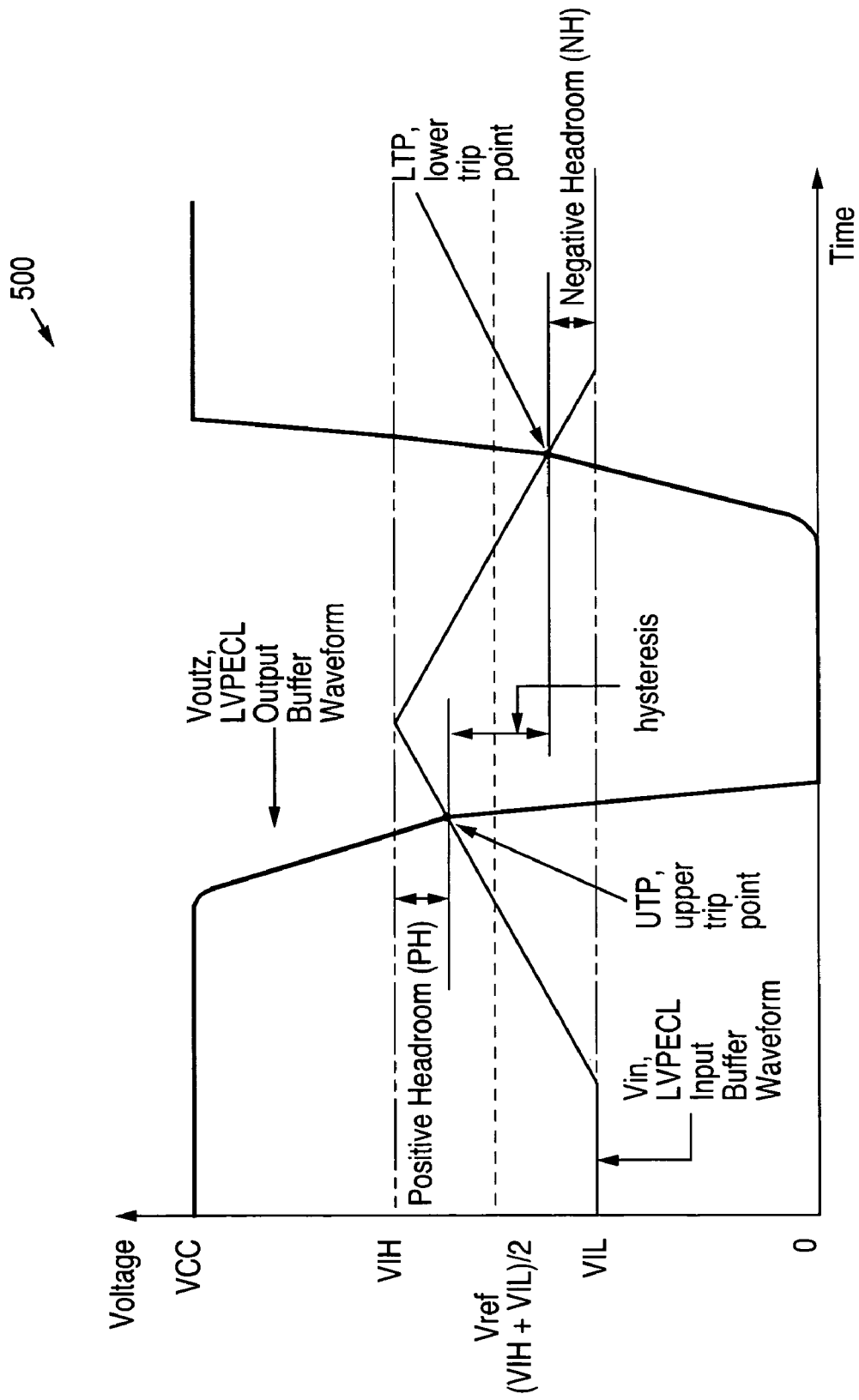
FIG. 5 is a timing diagram 500 illustrating an example of the operation of LVPECL input buffer 400, in accordance with the present invention.

In accordance with the present invention, FIG. 5 shows a timing diagram 500 that illustrates an example of the operation of LVPECL input buffer 400. As shown in FIG. 5, a low frequency triangular waveform is being applied to the input terminal Vin, of LVPECL input buffer 400. The purpose of this low frequency triangular waveform is to determine the upper trip point UTP, and the lower trip point LTP, of differential voltage comparator 410.

As shown in FIG. 5, the upper trip point UTP is located where the rising Vin voltage crosses the falling output voltage Voutz. Similarly, the lower trip point LTP is located where the falling Vin voltage crosses the rising output voltage Voutz.

As further shown in FIG. 5, a positive headroom PH (measured in volts) is also illustrated. Referring to FIG. 5, the positive headroom PH is equal to the difference between the LVPECL/PECL VIH voltage and the upper trip point voltage UTP. Therefore, because the VIH voltage for a PECL/LVPECL input buffer is equal to the VCC supply voltage minus 0.9V, the positive headroom PH will be equal to VCC−0.9−UTP volts.

Similarly, as shown in FIG. 5, a negative headroom NH (measured in volts) is also illustrated. Referring to FIG. 5, the negative headroom NH is equal to the difference between the lower trip point voltage LTP and the LVPECL/PECL VIL voltage. Therefore, because the VIL voltage for a PECL/LVPECL input buffer is equal to the VCC supply voltage minus 1.7V, the negative headroom NH will be equal to LTP−(VCC−1.7) volts.

By carefully adjusting the W/L ratios of transistors P1A, P3A, P1B and P3B, the positive headroom PH and the negative headroom NH can be made equal to each other, resulting in symmetric headroom. As described in greater detail below, the main advantage of providing symmetric headroom is that it allows an LVPECL/PECL buffer to have symmetric hysteresis, above and below the comparator Vref switching point. This symmetric hysteresis, in turn, provides symmetric noise immunity for the Vin signal, above and below the comparator Vref switching point.

As shown in FIG. 5, when the Vin input voltage begins to rise above the reference voltage Vref, the active low output voltage Voutz begins to fall from VCC towards ground, relatively slowly. However, when the rising Vin voltage reaches the upper trip point UTP, the active low output voltage Voutz quickly falls to ground (0V), due to the positive feedback provided by transistors P3A and P3B in FIG. 4.

Similarly, when the Vin voltage begins to fall below the reference voltage Vref, the active low output voltage Voutz begins to rise from ground (0V) towards VCC, relatively slowly. However, when the falling Vin voltage reaches the lower trip point LTP, the active low output voltage Voutz quickly rises towards VCC, due to the positive feedback provided by transistors P3A and P3B in FIG. 4.

As shown in FIG. 5, the difference between the upper trip point UTP and the lower trip point LTP is the input hysteresis, which provides increased noise immunity at the buffer Vin and Vref inputs. A large amount of hysteresis increases the noise immunity, and a small amount of hysteresis decreases the noise immunity.

Referring to FIG. 5, the hysteresis can be increased by raising the upper trip point UTP, and/or by lowering the lower trip point LTP. However, if the hysteresis is made too large, so that the positive headroom PH and/or the negative headroom NH go to zero or become negative, differential voltage comparator 410 in FIG. 4 will no longer be able to switch. As previously discussed, the upper/lower trip points and the input hysteresis can be controlled by selecting the W/L ratio of transistor P3A in comparison to transistor P1A, and by selecting the W/L ratio of transistor P3B in comparison to transistor P1B.

Figure 6:
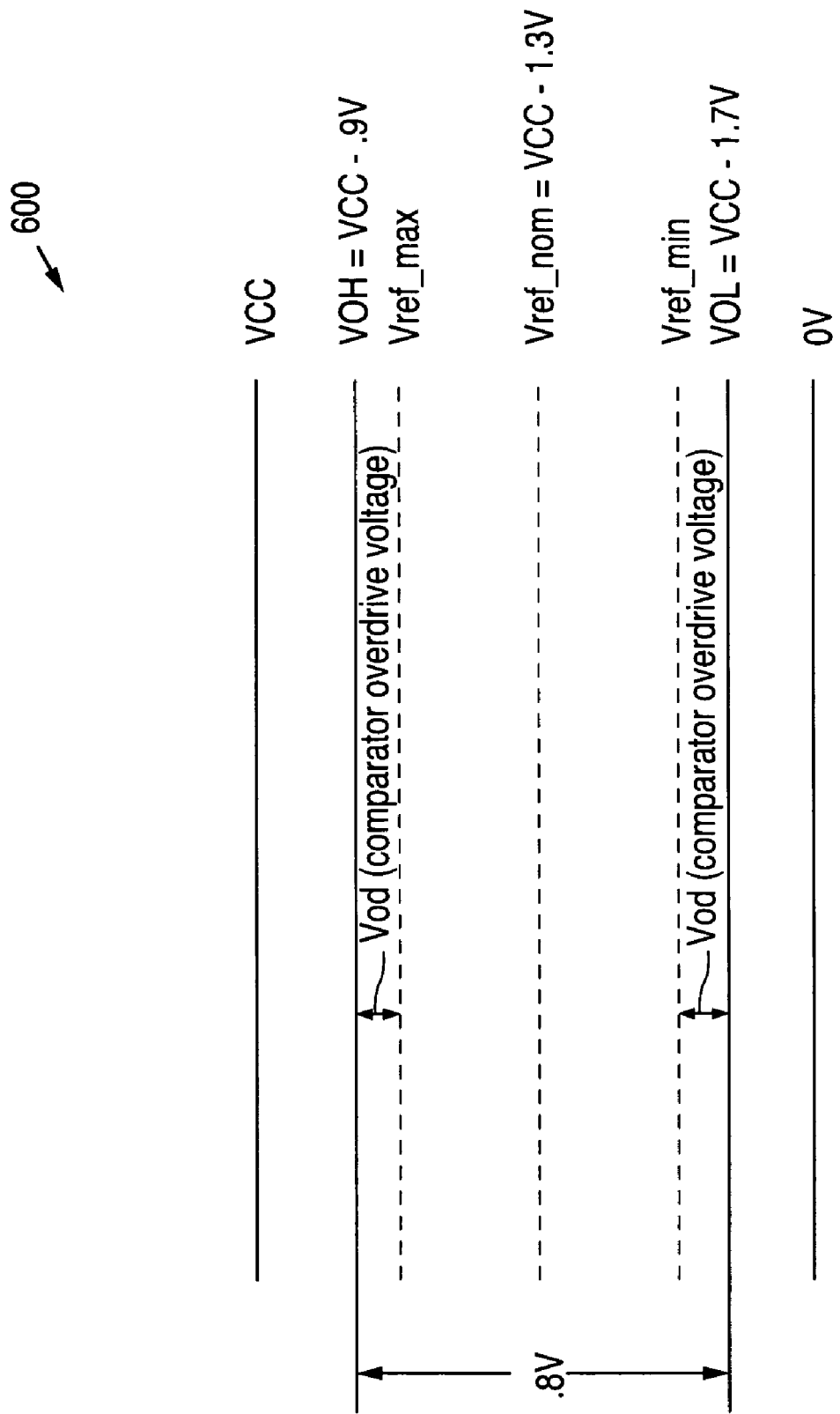
FIG. 6 is a voltage graph 600 illustrating a number of LVPECL/PECL input voltages, in accordance with the present invention.

FIG. 6 shows a voltage graph 600 that illustrates a number of LVPECL/PECL voltages in accordance with the present invention. Referring to FIG. 6, the LVPECL/PECL voltages include a logic high voltage VOH, which is equal to VCC−0.9V, a logic low voltage VOL, which is equal to VCC−1.7V, and a nominal reference voltage Vref_nom, which is equal to VCC−1.3V, midway between VOH and VOL. In addition, a maximum reference voltage Vref_max and a minimum reference voltage Vref_min are also illustrated. Thus, as shown in FIG. 6, in order for an LVPECL/PECL input buffer to operate properly, the reference voltage Vref must be maintained within a voltage band that is defined by Vref_max and Vref_min.

As shown by equation EQ. 1 below, the reference voltage Vref is equal to the power supply voltage VCC minus an offset voltage, Voffset.

$$Vref = VCC - Voffset \qquad \text{EQ. 1}$$

Furthermore, as shown by equation EQ. 1A below, Vref_nom, the nominal value of the reference voltage Vref, is equal to the power supply voltage VCC minus Voffset_nom, the nominal value of the offset voltage Voffset.

$$\text{Vref\_nom} = VCC - \text{Voffset\_nom} \qquad \text{EQ. 1A}$$

As previously discussed, Voffset_nom should be made equal to 1.3V.

As shown by equation EQ. 1, the reference voltage Vref will change when the power supply voltage VCC changes, and also when the offset voltage Voffset changes.

Furthermore, as stated above, in order for an LVPECL/PECL input buffer to operate properly, the reference voltage Vref must be maintained within a voltage band that is that is defined by the Vref_max and Vref_min voltages. Therefore, it is necessary to ensure that the maximum percentage change that the reference voltage Vref can make does not exceed the maximum percentage change that the reference voltage Vref is allowed to make.

As shown by equation EQ. 2 below, the maximum percentage change Vref_pct_max that the reference voltage Vref can be allowed to make is defined by the logic high voltage VOH, minus the nominal reference voltage Vref_nom, minus the minimum overdrive voltage Vod of differential voltage comparator 410, divided by the nominal reference voltage Vref_nom.

$$\text{Vref\_pct\_max} = \pm \frac{VOH - \text{Vref\_nom} - Vod}{\text{Vref\_nom}} \qquad \text{EQ. 2}$$

Thus, as shown by equation EQ. 2, the value of Vref_pct_max depends upon the values of VOH, Vref_nom, and Vod. However, since VOH is equal to VCC−0.9V, and Vref_nom is equal to VCC−1.3V, EQ. 2 can be re-written as shown in EQ. 2A below.

$$\text{Vref\_pct\_max} = \pm \frac{(VCC - 0.9) - (VCC - 1.3) - Vod}{VCC - 1.3} \qquad \text{EQ. 2A}$$

In the worst case, the lowest value of Vref_pct_max will occur when the power supply voltage VCC is at its maximum value (5.5V). Thus, assuming that the overdrive voltage Vod is approximately 50 mv, Vref_pct_max can be calculated as shown in equation EQ. 3 below.

$$\text{Vref\_pct\_max} = \pm \frac{0.4 - 0.050}{5.5 - 1.3} = 8.33\% \qquad \text{EQ. 3}$$

As shown by equation EQ. 3, the maximum allowable percentage change in the Vref voltage, Vref_pct_max, is only 8.33%.

The maximum percentage change that the offset voltage Voffset can be allowed to make is Voffset_pct_max. Thus Voffset_pct_max is a very important circuit parameter. As shown by equation EQ. 4 below, Voffset_pct_max is defined by the logic high voltage VOH, minus the nominal reference voltage Vref_nom, minus the minimum overdrive voltage Vod of differential voltage comparator 410, divided by the offset voltage Voffset.

$$\text{Voffset\_pct\_max} = \pm \frac{VOH - \text{Vref\_nom} - Vod}{\text{Voffset}} \qquad \text{EQ. 4}$$

However, since VOH is equal to VCC−0.9V, and Vref_nom is equal to VCC−1.3V, EQ. 4 can be re-written as shown in EQ. 4A below.

$$\text{Voffset\_pct\_max} = \pm \frac{(VCC - 0.9) - (VCC - 1.3) - Vod}{1.3} \qquad \text{EQ. 4A}$$

Since the VCC voltage cancels out in the numerator of EQ. 4A, EQ. 4A can be re-written as shown in EQ. 4B below.

$$\text{Voffset\_pct\_max} = \pm \frac{0.4 - Vod}{1.3} \qquad \text{EQ. 4B}$$

Thus, as shown by equation EQ. 4B, the value of Voffset_pct_max only depends upon the value of the overdrive voltage Vod. Therefore, assuming that Vod is approximately 50 mv, Voffset_pct_max can be computed as indicated in equation EQ. 5.

$$\text{Voffset\_pct\_max} = \pm \frac{0.4 - .050}{1.3} = 26.9\% \qquad \text{EQ. 5}$$

As shown by equation EQ. 5, Voffset_pct_max is equal to ±26.9%, which is relatively large. Nevertheless, this percentage change can be easily exceeded in most CMOS processes, so that a method for reducing Voffset_pct_max may need to be included in PECL input buffer 400, as explained in greater detail below.

As shown in FIG. 4, the offset voltage Voffset, with respect to the power supply voltage VCC, is defined by the product of resistor R4 and the intermediate current I4. However, as previously discussed, the intermediate current I4 is nearly constant because it depends upon the reference current Iref, which is nearly constant. Therefore, if the value of resistor R4 varies considerably, the offset-voltage Voffset will also vary considerably (i.e. beyond its minimum/maximum limit of ±26.9%), causing PECL input buffer 400 to malfunction.

In conventional semiconductor processing, the value of resistor R4 can vary considerably across process, voltage and temperature conditions (PVT conditions). As a result, the offset voltage Voffset (and therefore the reference voltage Vref) can also vary considerably across PVT. Thus a circuit is needed to keep the value of the offset voltage Voffset nearly constant, even when the value of resistor R4 varies considerably.

Figure 7:
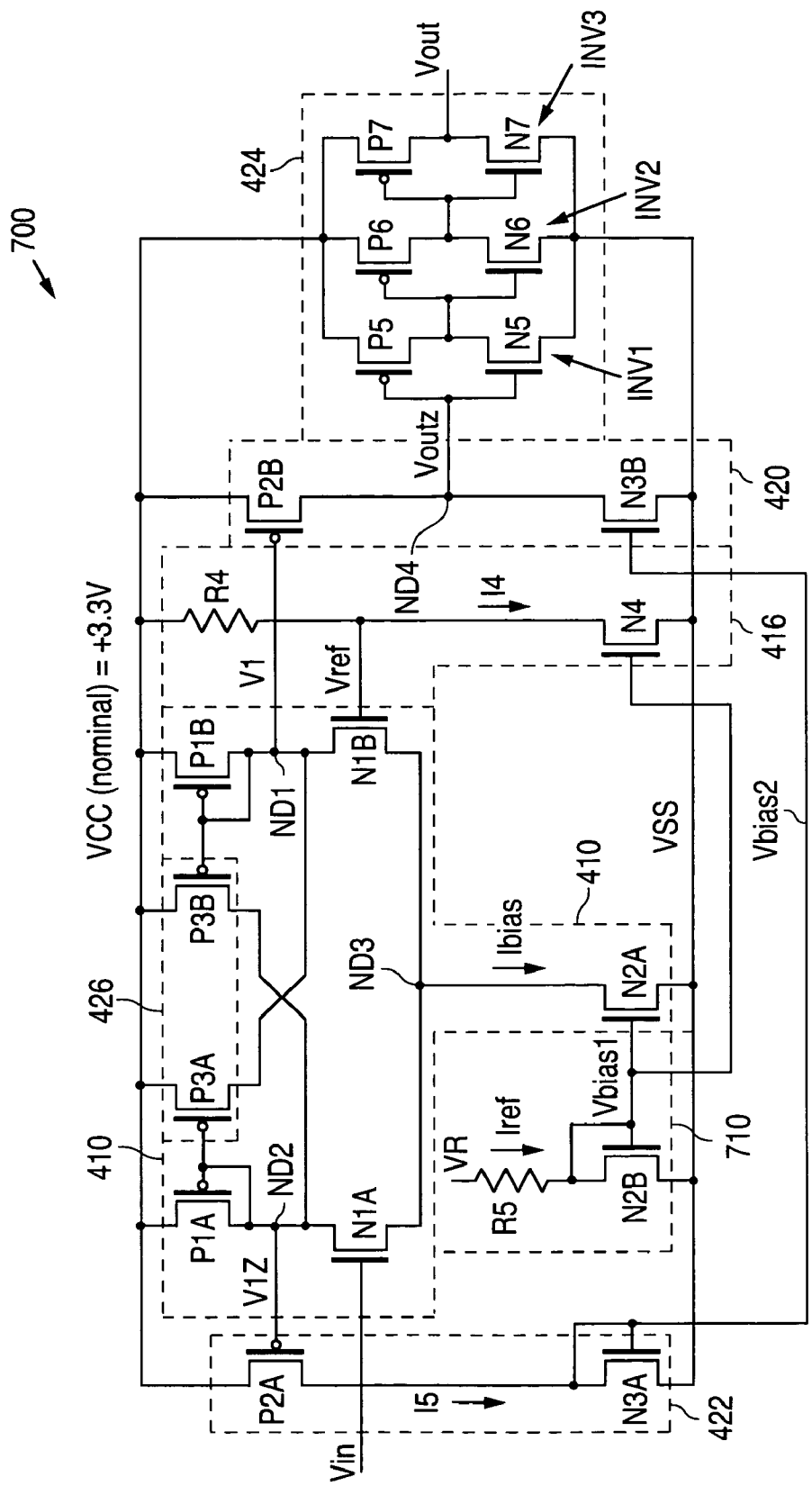
FIG. 7 is a circuit diagram illustrating an example of an LVPECL input buffer 700, in accordance with a first alternate embodiment of the present invention.

In accordance with a first alternate embodiment of the present invention, FIG. 7 shows a circuit diagram that illustrates an example of an LVPECL input buffer 700. LVPECL input buffer 700 is similar to LVPECL input buffer 400 and, as a result, utilizes the same reference numerals to designate the structures that are common to both buffers.

As shown in FIG. 7, LVPECL input buffer 700 differs from LVPECL input buffer 400, in that buffer 700 utilizes a voltage generator 710 in lieu of voltage generator 412. Voltage generator 710 differs from voltage generator 412 in that voltage generator 710 utilizes a resistor R5 and a constant voltage reference VR, to generate the reference current Iref, in lieu of the constant current source 414.

Referring to FIG. 7, the value of the reference current Iref can be calculated, as shown in EQ. 6 below.

$$Iref = \frac{VR - Vbias1}{R5} \qquad \text{EQ. 6}$$

As shown by equation EQ. 6, the reference current Iref varies inversely with the value of resistor R5. For example, if the value of resistor R5 increases by 30% due to PVT variations, then the magnitude of the reference current Iref will decrease by 30%. Similarly, if the value of resistor R5 decreases by 32% due to PVT variations, then the magnitude of the reference current Iref will increase by 32%.

As shown in FIG. 7, transistors N2B and N4 form a current mirror. Therefore, the intermediate current I4 can be calculated using equation EQ. 7 below.

$$I4 = Iref \cdot \frac{(W/L)_{N4}}{(W/L)_{N2B}} \qquad \text{EQ. 7}$$

Thus, as shown by equation EQ. 7, the intermediate current I4 is proportional to the reference current Iref and the relative W/L ratios of transistors N2B and N4.

Substituting EQ. 6 into EQ. 7, the value of I4 can be calculated using EQ. 8 below.

$$I4 = \frac{(VR - Vbias1)}{R5} \cdot \frac{(W/L)_{N4}}{(W/L)_{N2B}} \qquad \text{EQ. 8}$$

Furthermore, since the offset voltage Voffset is equal to R4*I4, the value of Voffset can be calculated using EQ. 9 below.

$$Voffset = \frac{R4 * (VR - Vbias1)}{R5} \cdot \frac{(W/L)_{N4}}{(W/L)_{N2B}} \qquad \text{EQ. 9}$$

As shown by EQ. 9, the value of the offset voltage Voffset depends upon the R4 to R5 ratio. However, the circumstances that cause the value of resistor R5 to increase or decrease by a certain percentage will also cause the value of resistor R4 to increase or decrease by the same percentage. In other words, in most CMOS processes, the ratio of resistors R4 and R5 will remain substantially constant over all PVT variations. Thus the value of the offset voltage Voffset will not change when the values of R4 and R5 change.

For simplicity, in the present example we can assume that the transistors N2B and N4 have equal W/L ratios. In this case, EQ. 9 can be simplified, as shown by EQ. 10 below.

$$Voffset = \frac{R4 * (VR - Vbias1)}{R5} \qquad \text{EQ. 10}$$

As shown by EQ. 10, the offset voltage Voffset depends upon the R4 to R5 ratio, which is substantially constant. Furthermore, the offset voltage Voffset also depends upon the VR reference voltage, which is also substantially constant. Therefore, the offset voltage Voffset will only change when the bias voltage Vbias1 changes.

Furthermore, variation of the bias voltage Vbias1 mainly depends upon two parameters: 1) the initial threshold of transistor N2B; and 2) the change of the transistor N2B threshold with temperature. Since both of the above parameters vary by only a small amount in comparison to the maximum allowable Voffset tolerance (±26.9%), the LVPECL input buffer shown in FIG. 7 will keep the offset voltage Voffset well within its minimum/maximum limits.

In the normal design procedure for PECL input buffer 700, the nominal values of VCC, VR, R5, $(W/L)_{N2B}$, $(W/L)_{N4}$ and R4 should be initially chosen to make the nominal offset voltage Voffset_nom equal to 1.3V. Thus, as required by the PECL/LVPECL specifications, this will make Vref_nom, the nominal value of the Vref voltage, equal to VCC−1.3V.

As shown in FIG. 7, the current mirror formed by transistors N2B and N2A forces the comparator tail current Ibias to be directly proportional to the variable reference current Iref. Therefore, when the value of resistor R5 varies, the reference current Iref will also vary, causing the tail current Ibias to also vary. As a consequence of this, the nominal value of the tail current Ibias must be high enough, so that when the tail current Ibias decreases, its minimum value will be high enough to allow the LVPECL comparator to operate at the required speed.

Figure 8:
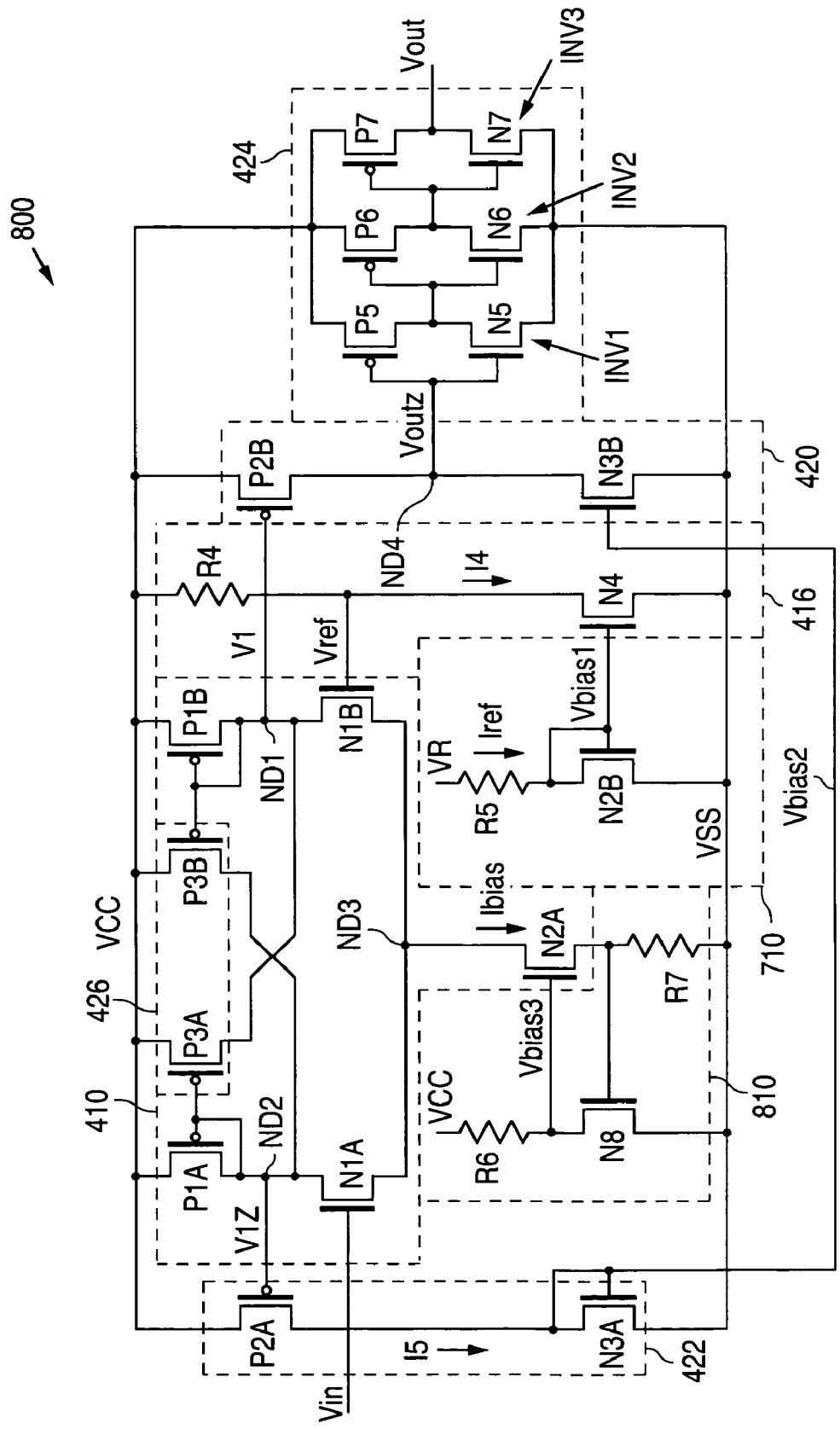
FIG. 8 is a circuit diagram illustrating an example of an LVPECL input buffer 800, in accordance with a second alternate embodiment of the present invention.

In accordance with a second alternate embodiment of the present invention, FIG. 8 shows a circuit diagram that illustrates an example of an LVPECL input buffer 800. LVPECL input buffer 800 is similar to LVPECL input buffer 700 and, as a result, utilizes the same reference numerals to designate the structures that are common to both buffers.

As shown in FIG. 8, LVPECL input buffer 800 differs from LVPECL input buffer 700 in that buffer 800 utilizes voltage generator 710 to provide the bias voltage Vbias1 to reference voltage circuit 416 only, and utilizes a bias circuit 810 to generate the Ibias tail current required by differential voltage comparator 410. Thus, as shown in FIG. 8, bias circuit 810 is now connected to generate the Ibias current, in lieu of connecting voltage generator 710.

The main advantage of bias circuit 810 is that it generates an Ibias current that has little dependence upon the value of VCC. This is achieved by limiting the gate-to-source overdrive voltage to transistor N8, and by making the width of transistor N8 sufficiently large, so that the Ibias current will mainly depend upon the threshold voltage of transistor N8, and the value of resistor R7. Because of this behavior, bias circuit 810 is sometimes referred to as a "threshold referenced" bias circuit.

As shown in FIG. 8, bias circuit 810 generates the Ibias current in transistor N2A by utilizing the supply voltage VCC, resistors R6 and R7, and transistor N8. Referring to FIG. 8, resistor R6 has a first terminal connected to the power supply voltage VCC, and a second terminal connected to the gate of transistor N2A. Furthermore, transistor N8 has a gate connected to the source of transistor N2A, a drain connected to the second terminal of resistor R6, and a source connected to ground. Moreover, resistor R7 has a first terminal connected to the source of transistor N2A and the gate of transistor N8, and a second terminal connected to ground.

As shown in FIG. 8, input buffer 800 contains two independent bias circuits, 810 and 710. As described above, bias circuit 810 provides an Ibias tail current (in transistor N2A) that has little dependence upon the value of VCC. In addition, bias circuit 710 provides a current I4 that is inversely proportional to the value of resistor R4, so that the voltage drop across resistor R4 is substantially constant (i.e. equal to 1.3V, independent of PVT variations).

It should be understood that the above descriptions are examples of the present invention, and that various alternatives of the invention described herein may be employed in practicing the invention. For example, as previously discussed, the logic level differences (VOH–VOL) for PECL and LVPECL are the same (800 mv). Furthermore, the logic level differences (VOH–VOL) are also independent of the power supply voltage VCC.

Because of these similarities, identical circuit design techniques can be utilized to provide input buffers (receivers) for a number of different device technologies that utilize a number of different power supply voltages. These power supply voltages include both standard PECL and LVPECL power supply voltages (e.g., 5V and 3.3V), and non-standard power supply voltages (e.g., 2.5V and 1.8V). Thus, except for the power supply voltage VCC and a minor amount of device scaling, the same input buffer circuitry can be employed for PECL and LVPECL types of circuits. Therefore, it is intended that the following claims define the scope of the invention, and that structures and methods within the scope of these claims and their equivalents be covered thereby.

What is claimed is:

1. An input buffer comprising:
a differential voltage comparator having a first input to receive an input signal, a second input to receive a reference voltage, and a third input, the differential voltage comparator varying a comparator output voltage on a first output and an inverse comparator output voltage on a second output in response to a difference between the input signal and the reference voltage;
a feedback circuit connected to source current into the first output when the comparator output voltage on the first output rises to a logic high, and into the second output when the inverse comparator output voltage on the second output rises to a logic high;
a reference circuit connected to supply the reference voltage to the second input of the differential voltage comparator, the reference circuit having an input to receive a bias voltage; and
a bias circuit connected to supply the bias voltage to the input of the reference circuit, the bias circuit supplying the bias voltage to the third input of the differential voltage comparator, the bias voltage to define a magnitude of a tail current in the differential voltage comparator.

2. The input buffer of claim 1 wherein the reference circuit includes:
a first resistive element connected to the second input of the differential voltage comparator; and
a first transistor connected to the second input of the differential voltage comparator, a current flowing through the first resistive element and the first transistor defining the reference voltage.

3. The input buffer of claim 2 wherein the bias voltage defines a magnitude of the current flowing through the first resistive element and the first transistor.

4. The input buffer of claim 3 wherein the bias circuit includes:
a constant current source connected to the third input of the differential voltage comparator, the constant current source to generate a bias current; and
a second transistor connected to the constant current source and the third input of the differential voltage comparator, the bias current to flow through the second transistor.

5. The input buffer of claim 4 and further comprising:
an inverting output circuit connected to the first output of the differential voltage comparator; and
a voltage source connected to the second output of the differential voltage comparator and the inverting output circuit.

6. The input buffer of claim 3 wherein the bias circuit includes:
a second resistive element connected to the third input of the differential voltage comparator; and
a second transistor connected to the second resistive element and the third input of the differential voltage comparator, a current to flow through the second resistive element and the second transistor.

7. The input buffer of claim 6 and further comprising:
an inverting output circuit connected to the first output of the differential voltage comparator; and
a voltage source connected to the second output of the differential voltage comparator and the inverting output circuit.

8. An input buffer comprising:
a differential voltage comparator having a first input to receive an input signal, a second input to receive a reference voltage, and a third input, the differential voltage comparator varying a comparator output voltage on a first output and an inverse comparator output voltage on a second output in response to a difference between the input signal and the reference voltage;
a feedback circuit connected to source current into the first output when the comparator output voltage on the first output rises to a logic high, and into the second output when the inverse comparator output voltage on the second output rises to a logic high;
a reference circuit connected to supply the reference voltage to the second input of the differential voltage comparator, the reference circuit having an input to receive a bias voltage, the reference circuit including:
a first resistive element connected to the second input of the differential voltage comparator; and
a first transistor connected to the second input of the differential voltage comparator, a current flowing through the first resistive element and the first transistor defining the reference voltage;
a bias circuit connected to supply the bias voltage to the input of the reference circuit; and
a control circuit to supply a control voltage to the third input of the differential voltage comparator, the control voltage to define a magnitude of a tail current in the differential voltage comparator.

9. The input buffer of claim 8 wherein the bias voltage defines a magnitude of the current flowing through the first resistive element and the first transistor.

10. The input buffer of claim 9 wherein the bias circuit includes:
a second resistive element connected to the input of the reference circuit; and
a second transistor connected to the second resistive element and the input of the reference circuit, a bias current to flow through the second resistive element and the second transistor.

11. The input buffer of claim 10 wherein the control circuit includes:
a third resistive element connected to the third input of the differential voltage comparator;
a third transistor connected to the third resistive element and the third input of the differential voltage comparator, a control current to flow through the third resistive element and the third transistor; and a fourth resistive element connected to the third transistor and the differential voltage comparator.

12. The input buffer of claim 11 and further comprising:

an inverting output circuit connected to the first output of the differential voltage comparator; and a voltage source connected to the second output of the differential voltage comparator and the inverting output circuit.

13. An input buffer comprising:

a voltage comparator having a first input to receive an input signal, a second input to receive a reference voltage, and a third input, the voltage comparator to compare the input signal received at the first input to the reference voltage received at the second input, and generate an output voltage on an output in response to a comparison between the input signal received at the first input and the reference voltage received at the second input;

a reference circuit connected to the voltage comparator, the reference circuit having a reference input, and including a resistive element connected to the second input of the voltage comparator, and a transistor connected to the resistive element, the reference circuit to generate the reference voltage in response to a current that flows through the reference circuit, the current that flows through the reference circuit flowing through the resistive element and the transistor, the reference voltage to be substantially constant; and a bias circuit connected to the voltage comparator and the reference circuit, the bias circuit to supply a single bias voltage to the third input of the voltage comparator and the reference input of the reference circuit.

14. The input buffer of claim 13 wherein the bias circuit includes a resistive element, the bias circuit to generate the bias voltage in response to a current that flows through the bias circuit, the current that flows through the bias circuit flowing through the resistive element in the bias circuit.

15. The input buffer of claim 14 wherein the resistive element in the reference circuit and the resistive element in the bias circuit are resistors.

16. The input buffer of claim 15 wherein the transistor in the reference circuit is connected to the second input.

17. An input buffer comprising:

a voltage comparator having a first input to receive an input signal, a second input to receive a reference voltage, and a third input, the voltage comparator to compare the input signal received at the first input to the reference voltage received at the second input, and generate an output voltage on an output in response to a comparison between the input signal received at the first input and the reference voltage received at the second input;

a reference circuit connected to the voltage comparator, the reference circuit having a reference input, and including a resistive element connected to the second input of the voltage comparator, and a transistor connected to the resistive element, the reference circuit to generate the reference voltage in response to a current that flows through the reference circuit, the current that flows through the reference circuit flowing through the resistive element and the transistor, the reference voltage to be substantially constant;

a first bias circuit connected to the voltage comparator, the first bias circuit having a resistive element, the first bias circuit to supply a first bias voltage to the third input of the voltage comparator in response to a current that flows through the first bias circuit, the current that flows through the first bias circuit flowing through the resistive element in the first bias circuit; and a second bias circuit connected to the reference circuit, the second bias circuit having a resistive element, the second bias circuit to supply a second bias voltage to the reference input of the reference circuit in response to a current that flows through the second bias circuit, the current that flows through the second bias circuit flowing through the resistive element in the second bias circuit.

18. The input buffer of claim 17 wherein:

the resistive element in the reference circuit, the resistive element in the first bias circuit, and the resistive element in the second bias circuit are resistors.

19. The input buffer of claim 18 wherein the transistor in the reference circuit is connected to the second input.

* * * * *